(12) United States Patent
Liu et al.

(10) Patent No.: US 6,659,847 B2
(45) Date of Patent: Dec. 9, 2003

(54) METHOD OF CLEANING A PROBE CARD

(75) Inventors: Yu-Hsin Liu, Hsinchu (TW); Kuang-Ping Tang, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/231,774

(22) Filed: Aug. 28, 2002

(65) Prior Publication Data

US 2003/0060131 A1 Mar. 27, 2003

(30) Foreign Application Priority Data

Sep. 4, 2001 (TW) .................................... 90121876 A

(51) Int. Cl.⁷ ............................................... B24B 1/00
(52) U.S. Cl. ............................ 451/57; 451/58; 451/11; 451/28; 134/6
(58) Field of Search ........................ 451/10, 11, 28, 451/41, 57, 58, 49; 134/6, 18

(56) References Cited

U.S. PATENT DOCUMENTS

| | | | |
|---|---|---|---|
| 4,952,272 A | * | 8/1990 | Okino et al. ................. 156/630 |
| 5,920,081 A | * | 7/1999 | Chen et al. ..................... 257/48 |
| 6,257,958 B1 | * | 7/2001 | Angell et al. ................... 451/9 |
| 6,420,891 B1 | * | 7/2002 | Liu ............................. 324/757 |
| 6,541,990 B1 | * | 4/2003 | Migliaccio .................. 324/755 |

* cited by examiner

Primary Examiner—Eileen P. Morgan
(74) Attorney, Agent, or Firm—Ladas & Parry

(57) ABSTRACT

A method of cleaning a probe card with probe pins contaminated by testing residue. A cleaning wafer is provided and the uneven surface and the grooves thereon are used to polish surfaces of the probe pins. Two kinds of cleaning operations, which utilize smaller and larger accelerations driving the cleaning wafer, are performed. The cleaning operations utilizing the smaller acceleration are used to polish the surfaces of the probe pins and the cleaning operations utilizing the larger acceleration are used to smooth the uneven surfaces of the probe pins after the former polishing operations. In addition, the cleaning wafer is rotated by various rotation angles to obtain superior cleaning.

8 Claims, 7 Drawing Sheets

(2 of 7 Drawing Sheet(s) Filed in Color)

METHOD OF CLEANING A PROBE CARD

BACKGROUND OF THE INVENTION

1. Field of the Invention

The present invention relates in general to a method of cleaning a probe card for testing semiconductor wafers, more specifically, to a method of effectively cleaning a probe card whose probe tips have been contaminated by debris during testing.

2. Description of the Related Art

In conventional semiconductor fabrication, wafers, prior to being cut into individual chips, are tested by a probe card to evaluate if the function of the semiconductor chips thereon is normal. During testing, a plurality of probe pins of the probe card physically contact the testing pads on the wafer under test to measure the electrical properties of semiconductor devices formed on the wafer. However, after long use, the probe pin tips are usually contaminated by various metal particles and their oxides, which influences the accuracy of the testing results during testing and lowers the test quality. Thus, the probe card must be cleaned to remove the residue on the probe tips after long use.

FIG. 1 is a schematic diagram illustrating the conventional cleaning process for the probe card. As shown in FIG. 1, the cleaning process is performed using a cleaning wafer. During the period of cleaning, probe tips 3 of probe pins 1 are regularly in contact with the surface of the cleaning wafer 5 to remove accumulated residue.

FIGS. 2A, 2B, 2C and 2D are sectional views illustrating the conventional cleaning process of the probe card. First, the probe card 10 remains motionless and the cleaning wafer 5 is lifted (step S1, as shown in FIG. 2B). When the cleaning wafer 5 moves and contacts the probe tips 3 of probe card 10, sliding and polishing actions happen between the surface of the cleaning wafer 5 and the probe tips 3 due to compression, and are mainly used to remove accumulated residue (step S2, as shown in FIG. 2C). Next, the cleaning wafer 5 is lowered (step S3, as shown in FIG. 2D). Steps S1–S3 are recursively performed for several times to complete the overall cleaning process.

In the conventional cleaning process, acceleration/deceleration of the cleaning wafer 5's approach to or departure from the probe tips 3 is about 26.7 mm/s$^2$, a large value. In addition, the cleaning is achieved by using irregular grooves on the cleaning wafer 5, which have a width of about 10 $\mu$m, as the polishing mechanism. Usually, the cleaning wafer 5 only moves in the vertical direction and is not controlled in the horizontal direction in conventional cleaning process, and the polishing effect is made by compressing and rubbing the probe tips.

The conventional cleaning process can obtain a relatively good cleaning outcome, however some types of residue, such as melted aluminum debris that usually appears black, cannot be effectively removed by the conventional cleaning process. FIGS. 3A and 3B are photographs showing the appearances of the surfaces of the probe tips before and after the conventional cleaning process. As shown in FIG. 3A, the residue region appears black and is difficult to remove. Thus, after the conventional cleaning process, the residue region still remains in FIG. 3B, which means the cleaning operation cannot completely remove contaminant formed on the probe card.

SUMMARY OF THE INVENTION

An object of the present invention is to provide a method of cleaning a probe card or the probe pins thereon for cleaning the residue regions, especially those that are hard to remove, thereby obtaining a superior cleaning and ensuring the accuracy and the quality of the test procedure performed by the probe card.

According to the object described above, the present invention provides a method of cleaning a probe card with probe pins contaminated by testing residue. A cleaning wafer is provided first and the uneven surface and the grooves thereon are used to contact and compress the surfaces of the probe pins to polish the surfaces of the probe pins. There are two kinds of cleaning operations, depending on acceleration/deceleration of driving the cleaning wafer to approach and depart from the probe card, are performed. In the first kind of cleaning operation, the cleaning wafer is driven by a smaller acceleration for a first number of times to polish the surfaces of the probe pins. The optimization of the smaller acceleration/deceleration varies with the type of residue. For example, the optimized acceleration for melted aluminum debris is about 5~6.7 mm/s$^2$. In the second kind of cleaning operation, the cleaning wafer is driven by a larger acceleration for a second number of times to smooth the surfaces of the probe pins. The larger acceleration is about 26.7 mm/s$^2$. In addition, the cleaning wafer is rotated by various rotation angles to obtain superior cleaning.

BRIEF DESCRIPTION OF THE DRAWINGS

The above-identified patent or application file contains at least one drawing executed in color. Copies of this patent or patent application publication with color drawings will be provided by the Office upon request and payment of the necessary fee.

The present invention can be more fully understood by reading the subsequent detailed description in conjunction with the examples and references made to the accompanying drawings, wherein.

DETAILED DESCRIPTION OF THE INVENTION

In the present invention, the feed rate of the cleaning wafer during cleaning and the orientation of the cleaning wafer are adjusted to obtain superior polishing for the probe tips of the probe card. If the cleaning wafer is regarded as a cutting tool and the probe tip is regarded as a work piece, feed rate represents the speed of the work piece's approach toward the cutting tool. In addition, the arrangement of the grooves on the cleaning wafer, which deeply affects the polishing effect, is random. Thus, in this preferred embodiment, the orientation of the cleaning wafer is also an operational factor to obtain superior cleaning.

Figure 1:
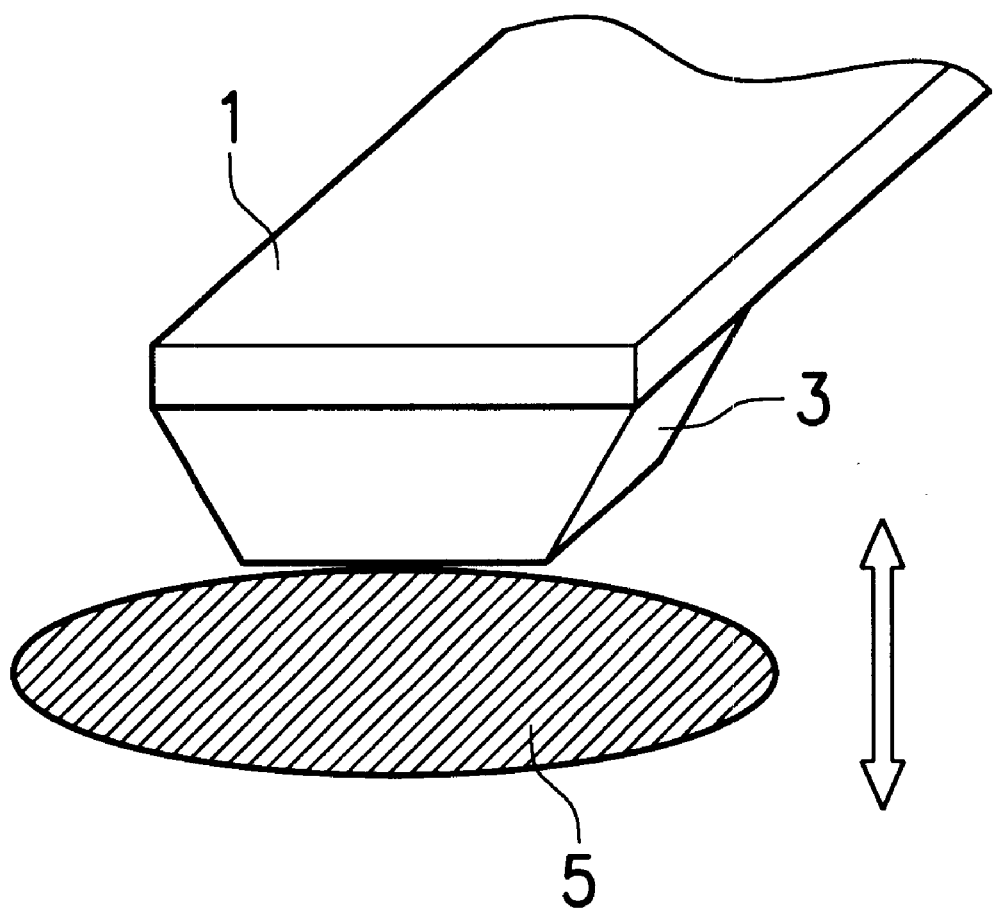
FIG. 1 is a schematic diagram illustrating the conventional cleaning process of the probe card.
Figure 2A:
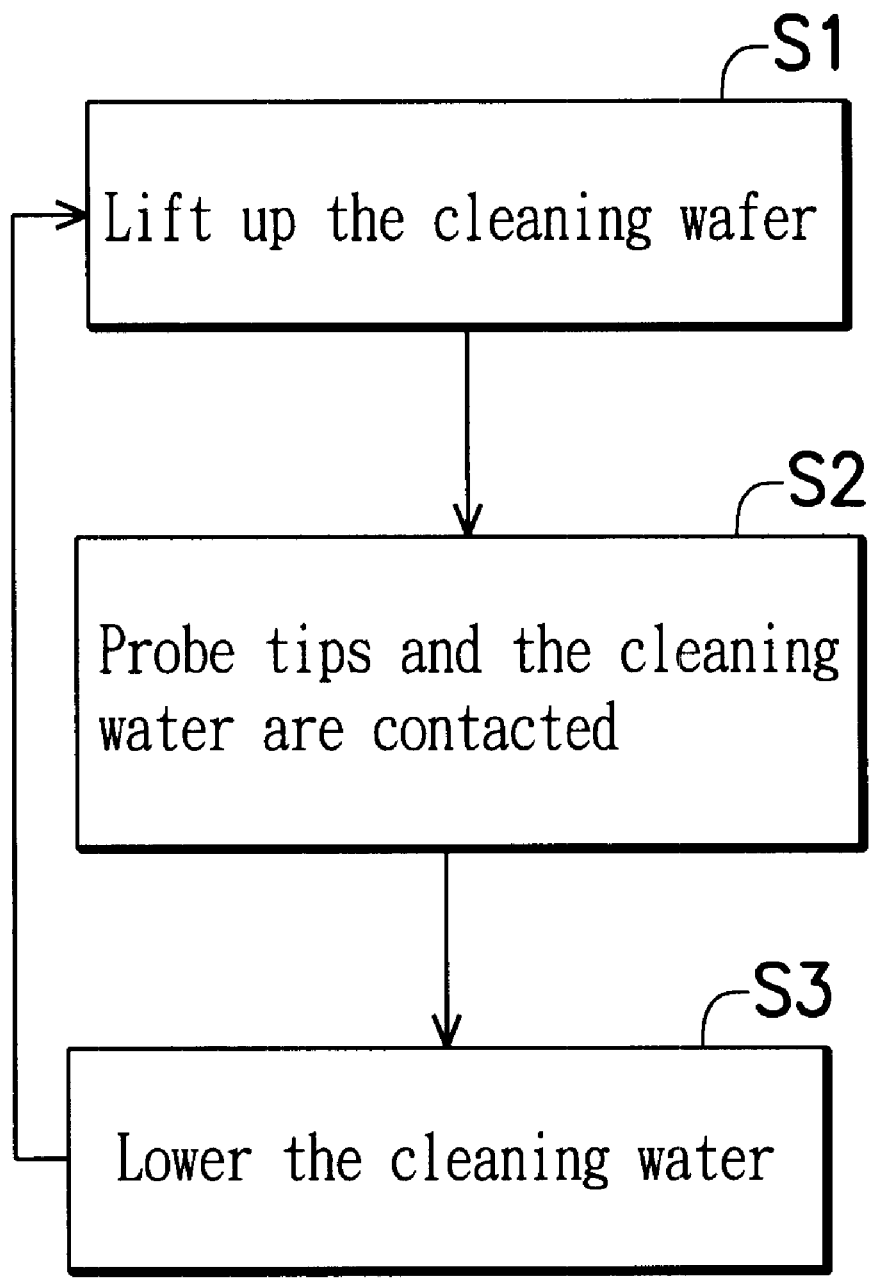
FIGS. 2A, 2B, 2C and 2D are sectional views illustrating the conventional cleaning process of the probe card.
Figure 2B:
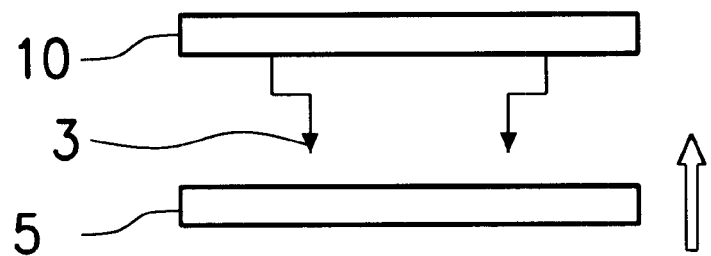
Figure 2C:
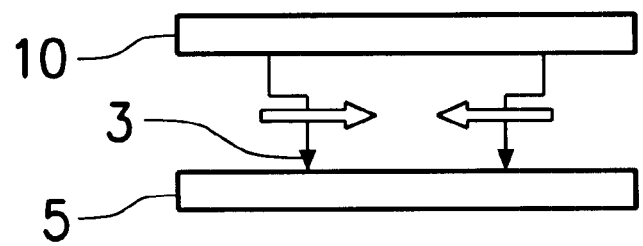
Figure 2D:
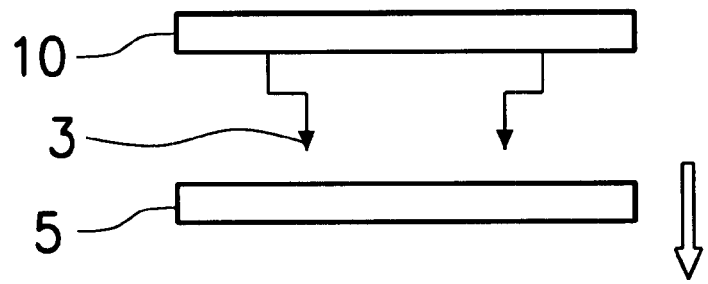
Figure 3A:
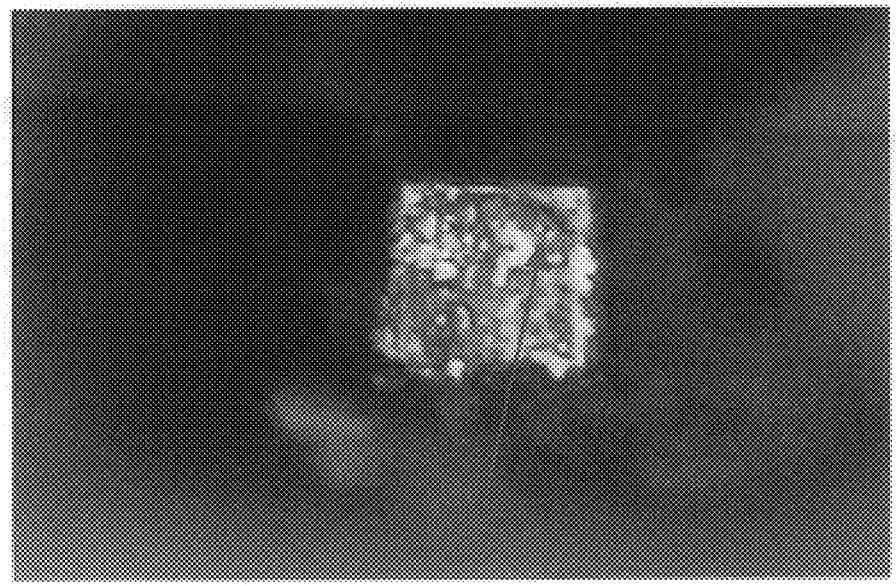
FIGS. 3A and 3B are photographs showing the appearance of the probe tip surfaces before and after the conventional cleaning process.
Figure 3B:
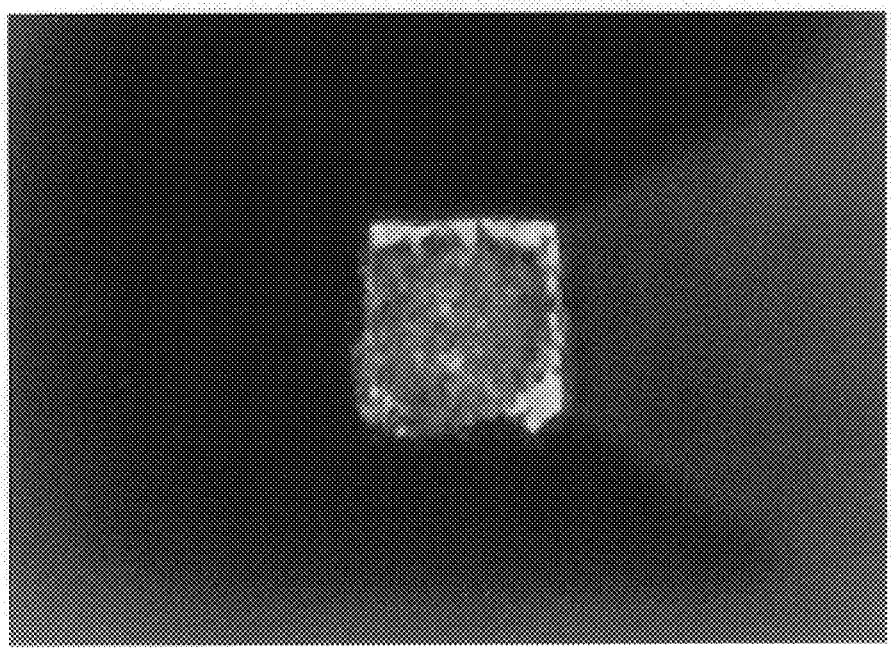
Figure 4:
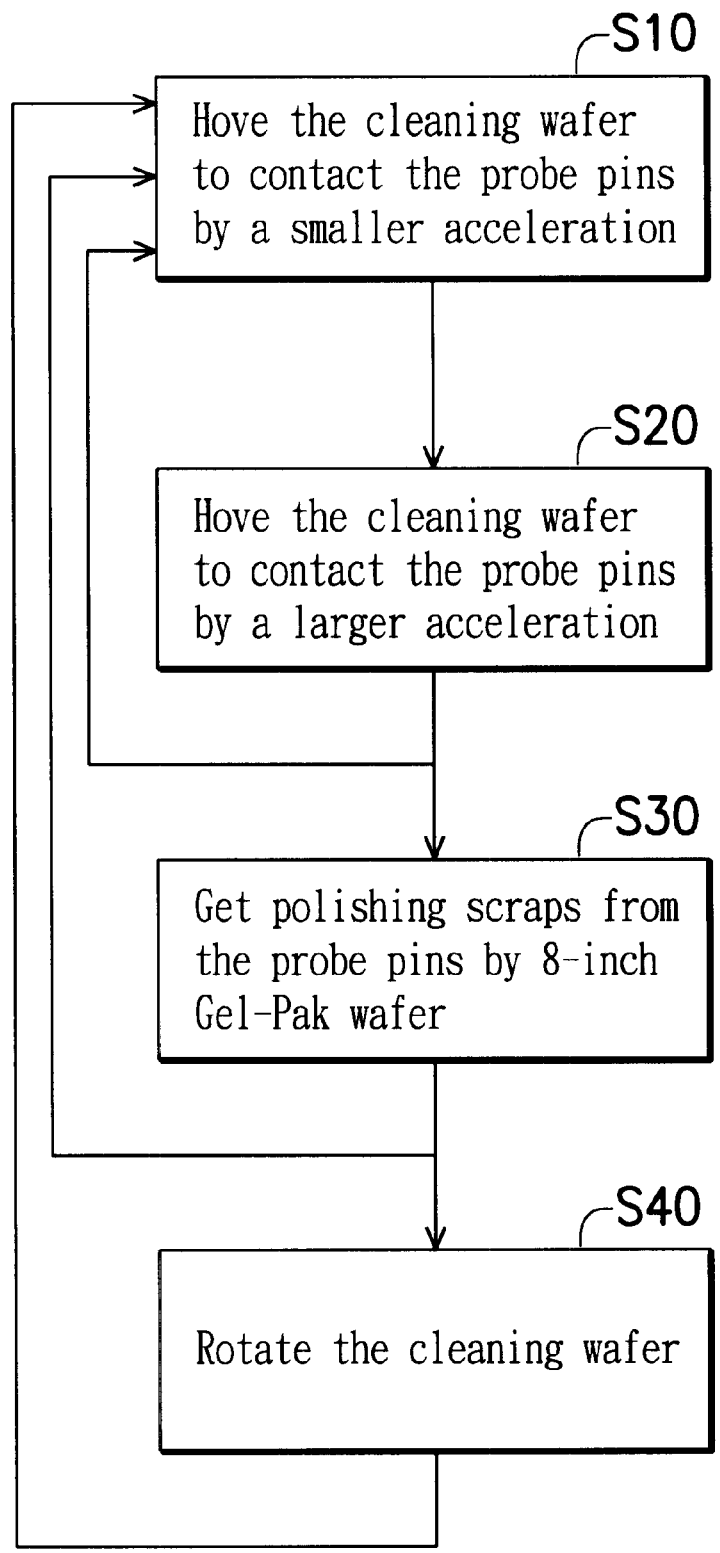
FIG. 4 is a flowchart illustrating the method of cleaning the probe card in accordance with the embodiment of the present invention.

FIG. 4 is a flowchart illustrating the method of cleaning the probe card in accordance with the embodiment of the present invention. As shown in FIG. 4, the main step of the method of cleaning the probe tips is step S10, which repeatedly moves the cleaning wafer to contact the surfaces of the probe tips by a smaller acceleration for a first number of times to obtain superior cleaning. Since the cleaning wafer speeds up by a smaller acceleration to polish the surfaces of the probe tips, the contact velocity between the probe tips and the cleaning wafer is slower and difficult residue, such as melted aluminum debris, can be easily cleaned. In practical operation, acceleration/deceleration of the cleaning wafer's approach to or departure from the probe card can be modified by the settings of the cleaning machine. Generally speaking, the optimization of the smaller acceleration described above varies with the type of residue. For example, the optimized acceleration to polish or cleaning the melted aluminum debris is about $5\sim6.7$ mm/s$^2$.

In addition, since the surfaces of the probe tips become uneven after the step of polishing the surfaces of the probe tips by the smaller acceleration, the next step S20, applied by a acceleration compared with the former cleaning step S10, is used to smooth the surfaces of the probe tips. Such larger acceleration is preferably the same as the default settings of the normal cleaning machine, that is, about 26.7 mm/s$^2$. In addition, the cleaning step S10 utilizing the smaller acceleration and the cleaning step S20 utilizing the larger acceleration can be alternately applied to the probe card to obtain superior cleaning.

In addition, between the cleaning steps described above, a step S30 of applying an 8-inch Gel-Pak wafer is applied to remove polishing scraps from the surfaces of the probe tips to obtain superior cleaning. That is, the polishing scraps adhere to the Gel-Pak wafer surface and can be removed.

Figure 5A:
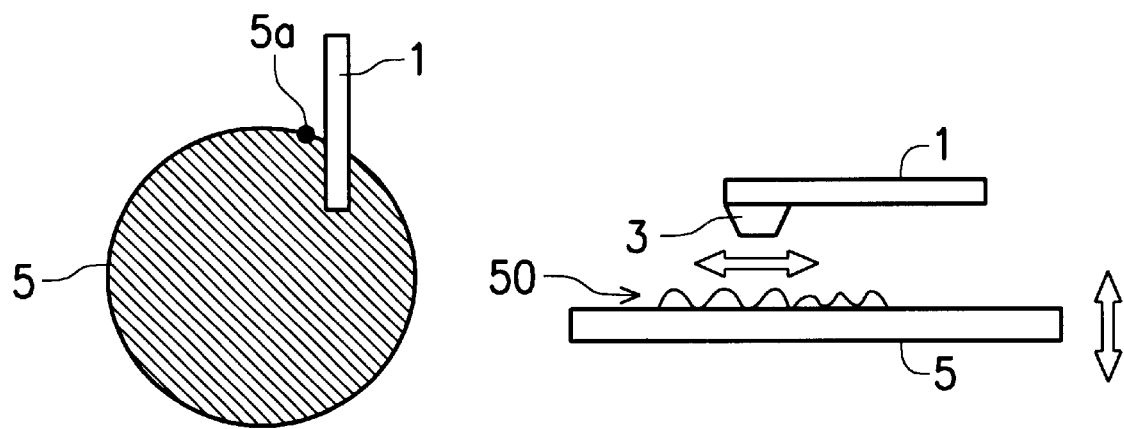
FIGS. 5A and 5B illustrate top views and side views of the cleaning wafer when the cleaning wafer does not rotate and rotates by a rotation angle of 90°, respectively.
Figure 5B:
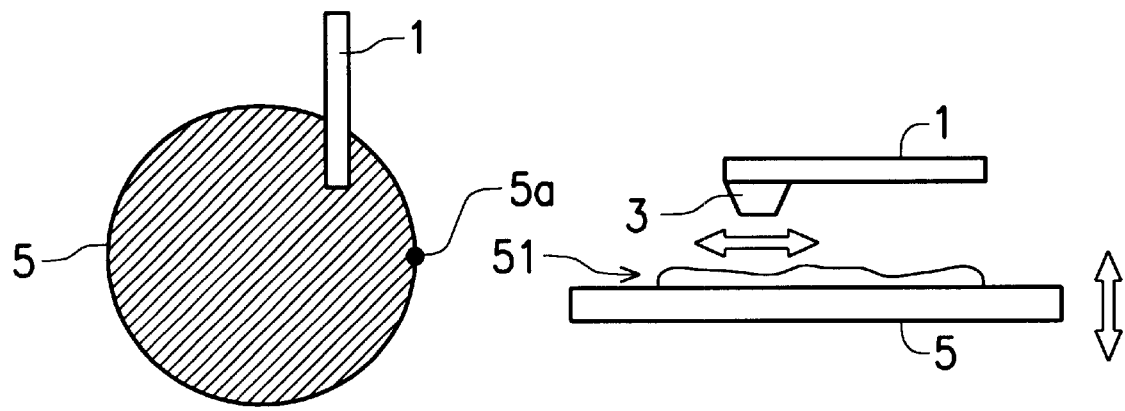

In addition, the orientation of the cleaning wafer and the arrangement of the grooves thereon affect the polishing effect. However, the arrangement of the wafer grooves is uncontrollable. Thus, in this embodiment, a step S40 of rotating the cleaning wafer by a predetermined rotation angle is optionally applied before the recursive steps S10 and S20 to obtain superior cleaning. The rotation of the cleaning wafer can be controlled in view of the orientation flat of the cleaning wafer. FIGS. 5A and 5B illustrate top and side views of the cleaning wafer when the cleaning wafer does not rotate and rotates by a rotation angle of 90°, respectively. As shown in the figures, the rotation status of the cleaning wafer 5 can be identified by the orientation flat 5a. Meanwhile, the profile of the grooves thereon relative to the probe card is also changed. In the situation shown in FIGS. 5A and 5B, the groove profile 50 that will contact the probe tips 3 heavily fluctuates when the cleaning wafer 5 does not rotate. When the cleaning wafer 5 rotates by a rotation angle of 90°, the groove profile 51 that will contact the probe tips 3 are relatively smooth. It is noted that in FIGS. 5A and 5B the grooves on the cleaning wafer are illustrated as straight lines, but the arrangement of these grooves may be quite random in practical cases. Thus, rotating the cleaning wafer by several predetermined angles is beneficial to the improvement of the cleaning.

In addition, it is understood by those skilled in the art that the sequence of the cleaning steps shown in FIG. 4 can be varied according to practical applications.

Figure 6A:
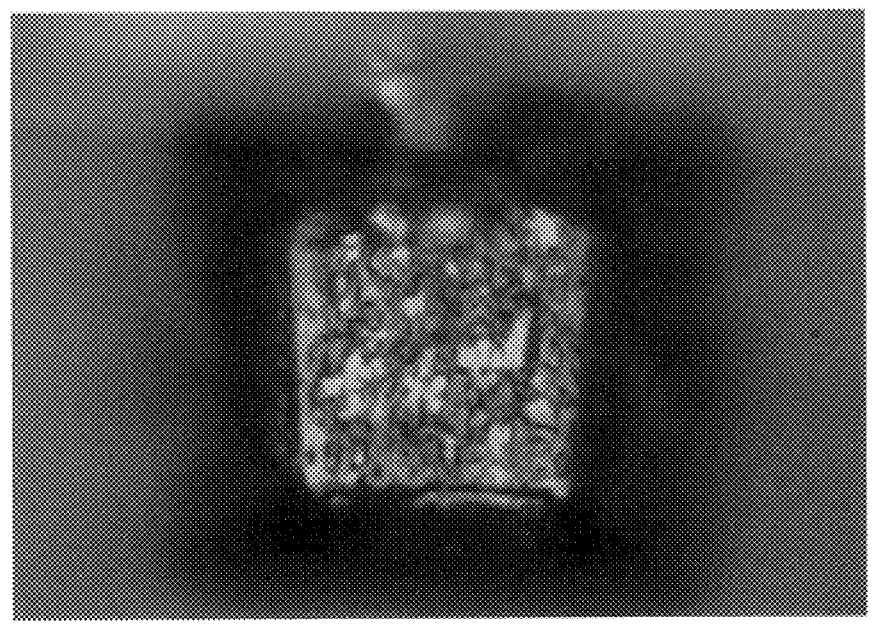
FIGS. 6A and 6B are photographs showing the appearance of the surfaces of the probe tips before and after the cleaning process in accordance with the preferred embodiment of the present invention.
Figure 6B:
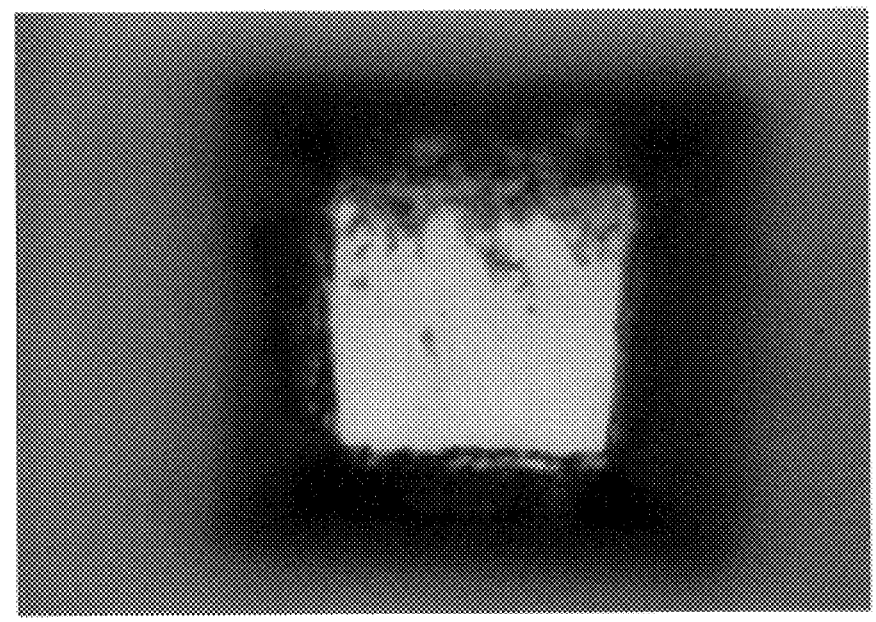

FIGS. 6A and 6B are photographs showing the appearance of the surface of the probe tips before and after the cleaning process in accordance with the preferred embodiment of the present invention. In this case, acceleration/deceleration of the cleaning wafer's approach to or departure from the probe card is about 6.7 mm/s$^2$ by rotation angles of 0°, 90°, 180° and 270°. For each of the rotation angles, 200 polishing and smoothing steps are recursively performed. As shown in FIG. 6B, the cleaning method of the present invention can effectively remove the dark region from the surfaces of the probe tips.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A probe-cleaning method for a probe card, comprising the steps of:
   providing a cleaning wafer;
   polishing a surface of a probe pin of the probe card by moving the cleaning wafer to contact with the surface of the probe pin with a first acceleration rate for a plurality of times; and
   smoothing the surface of the probe pin by moving the cleaning wafer to contact with the surface of the probe pin with a second acceleration rate for a plurality of times, wherein the second acceleration rate is faster than the first acceleration rate.

2. The method as recited in claim 1, wherein the method further comprises the following steps prior to the smoothing step:
   rotating the cleaning wafer by a first angle and repeating the polishing step.

3. The method as recited in claim 2, wherein the first angle is 90°, 180°, or 270°.

4. The method as recited in claim 1, wherein the method further comprises the following steps:
   rotating the cleaning wafer by a second angle and repeating the smoothing step.

5. The method as recited in claim 4, wherein the second angle is 90°, 180°, or 270°.

6. The method as recited in claim 1, wherein the polishing step and the smoothing step are repeated for a plurality of times.

7. The method as recited in claim 1, wherein the first acceleration rate is about $5\sim6.7$ mm/s$^2$.

8. The method as recited in claim 1, wherein the method further comprises the following step:
   adhering scraps from the probe pin to a surface of another wafer.

* * * * *